United States Patent [19]
Broedner et al.

[11] 3,950,654
[45] Apr. 13, 1976

[54] POWER-ON INITIALIZING CIRCUIT FOR A CALCULATOR SYSTEM

[75] Inventors: Walter F. Broedner, Sunnyvale; Ravinder K. Bhatnagar; W. Eugene Hill, both of Cupertino; Daniel W. Tjoa, San Jose, all of Calif.

[73] Assignee: American Microsystems, Inc., Santa Clara, Calif.

[22] Filed: Nov. 14, 1974

[21] Appl. No.: 523,809

[52] U.S. Cl. ............... 307/208; 307/87; 307/293; 307/297; 328/62
[51] Int. Cl.² ................. H03K 1/12; H03K 5/153
[58] Field of Search ....... 307/208, 215, 246, 247 A, 307/291, 293, 297, 296, 87; 328/55, 60, 195, 196, 62

[56] References Cited
UNITED STATES PATENTS

| | | | |
|---|---|---|---|
| 3,218,473 | 11/1965 | Madsen | 307/296 X |
| 3,732,442 | 5/1973 | Husbands | 307/293 X |

OTHER PUBLICATIONS
Hanchett, "Turn-on" Reset Circuits, RCA Technical Notes No. 927, Mar. 1973.

*Primary Examiner*—Alfred E. Smith
*Assistant Examiner*—E. R. La Roche
*Attorney, Agent, or Firm*—Owen, Wickersham & Erickson

[57] ABSTRACT

An initializing circuit for automatically providing a pulse of a duration sufficient to initialize all the relevant storage elements in an electronic calculator computing system having one or two power supplies. It comprises a power-on pulse generator controlled by two phase clock buffers utilizing a feed-back loop including a bit of delay to guarantee a minimum of one bit time duration for the power-on level. The two phase clock buffers are activated at turn-on to remain in a steady state by a power-on level detecting sub-circuit to control the pulse generator. When a one bit pulse is insufficient to initialize the system, a flip-flop and a counter may be used to generate a longer pulse.

13 Claims, 8 Drawing Figures

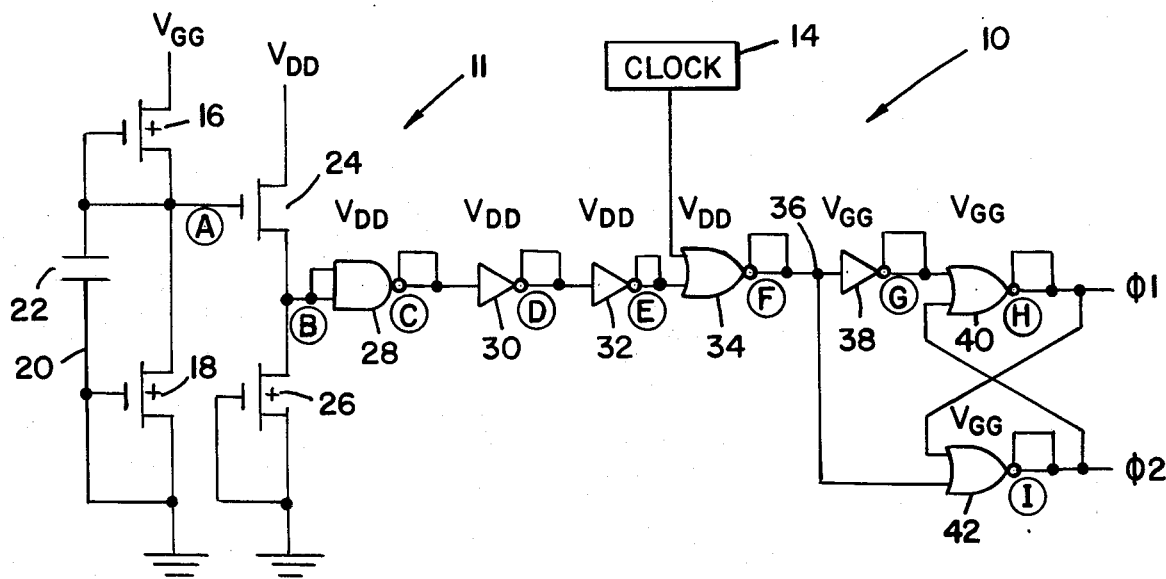
FIG_1
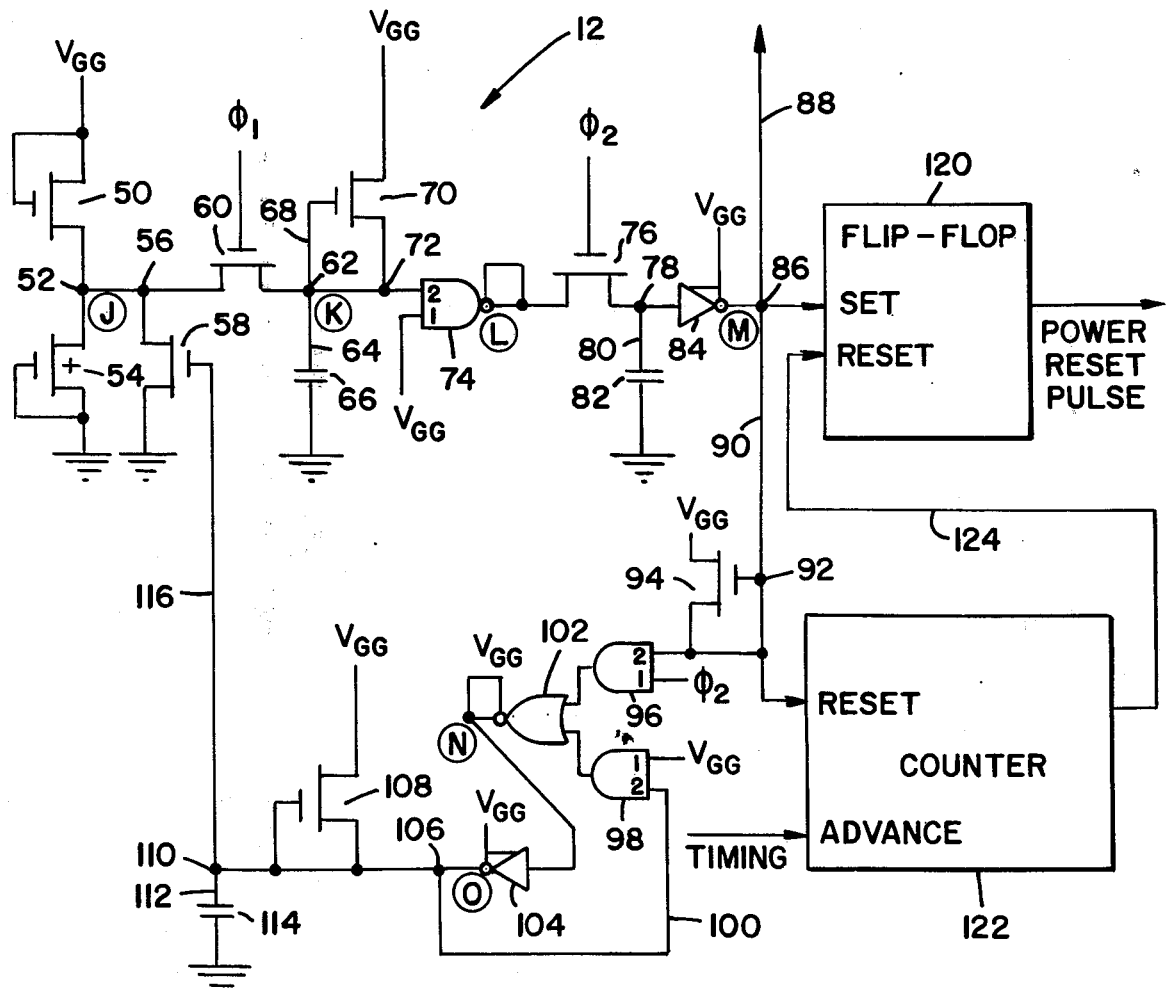
FIG_2

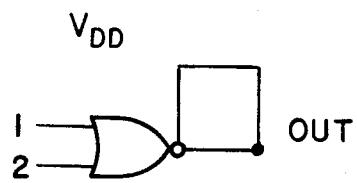
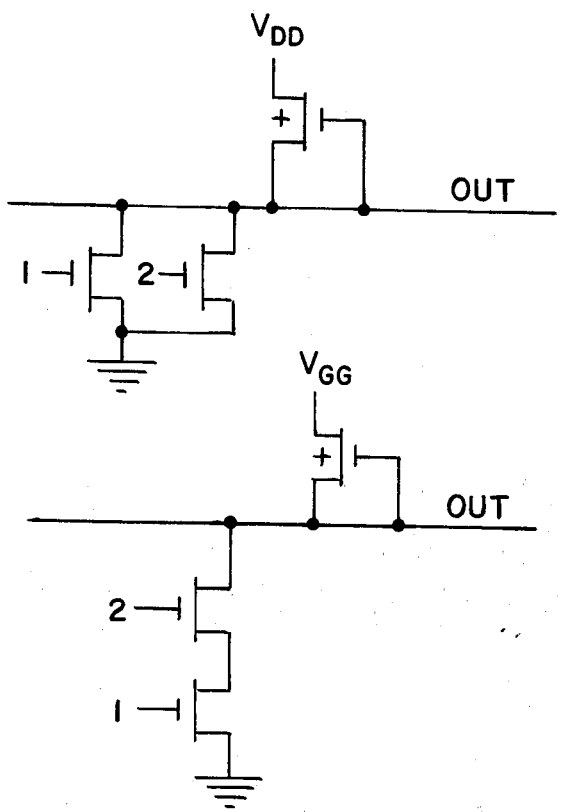
FIG_3
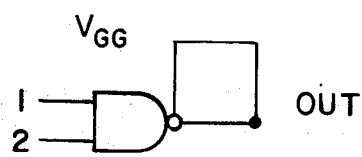
FIG_4
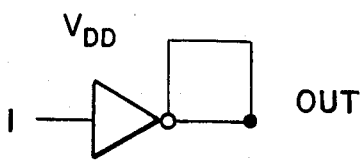
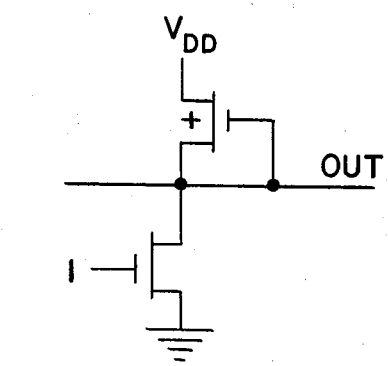
FIG_5
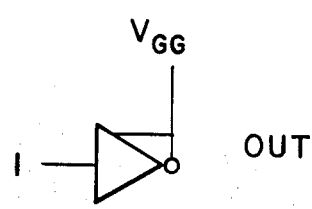
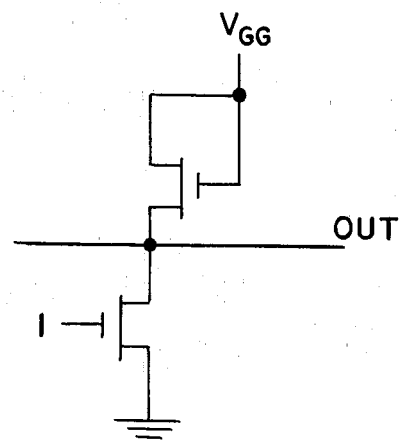
FIG_6

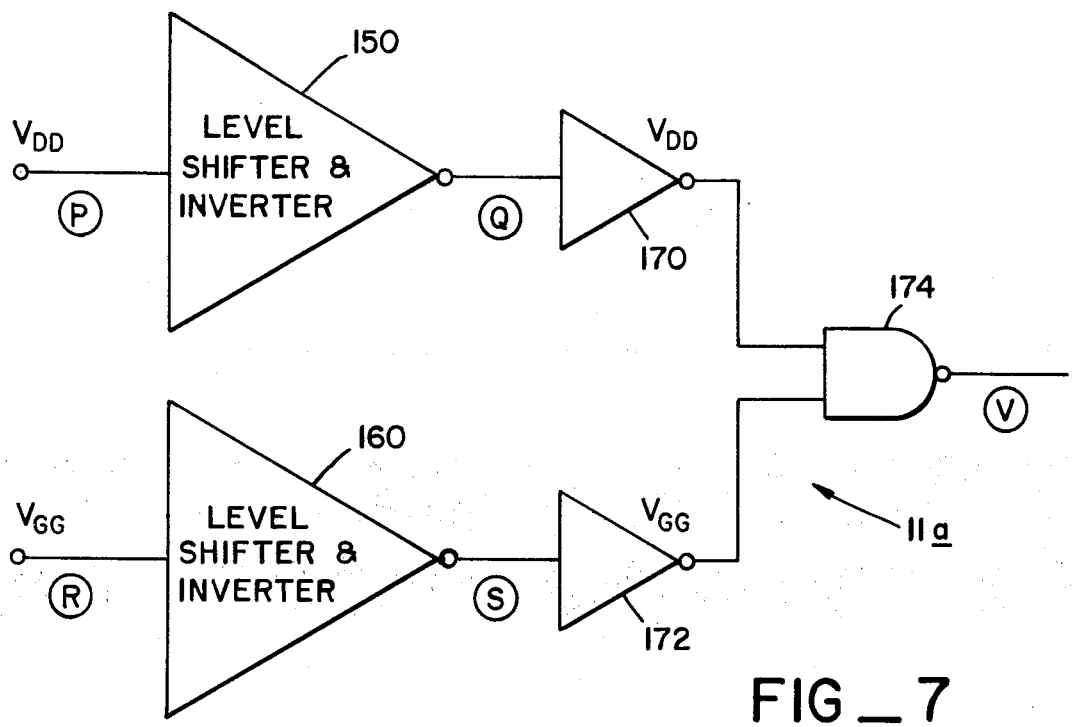
FIG_7
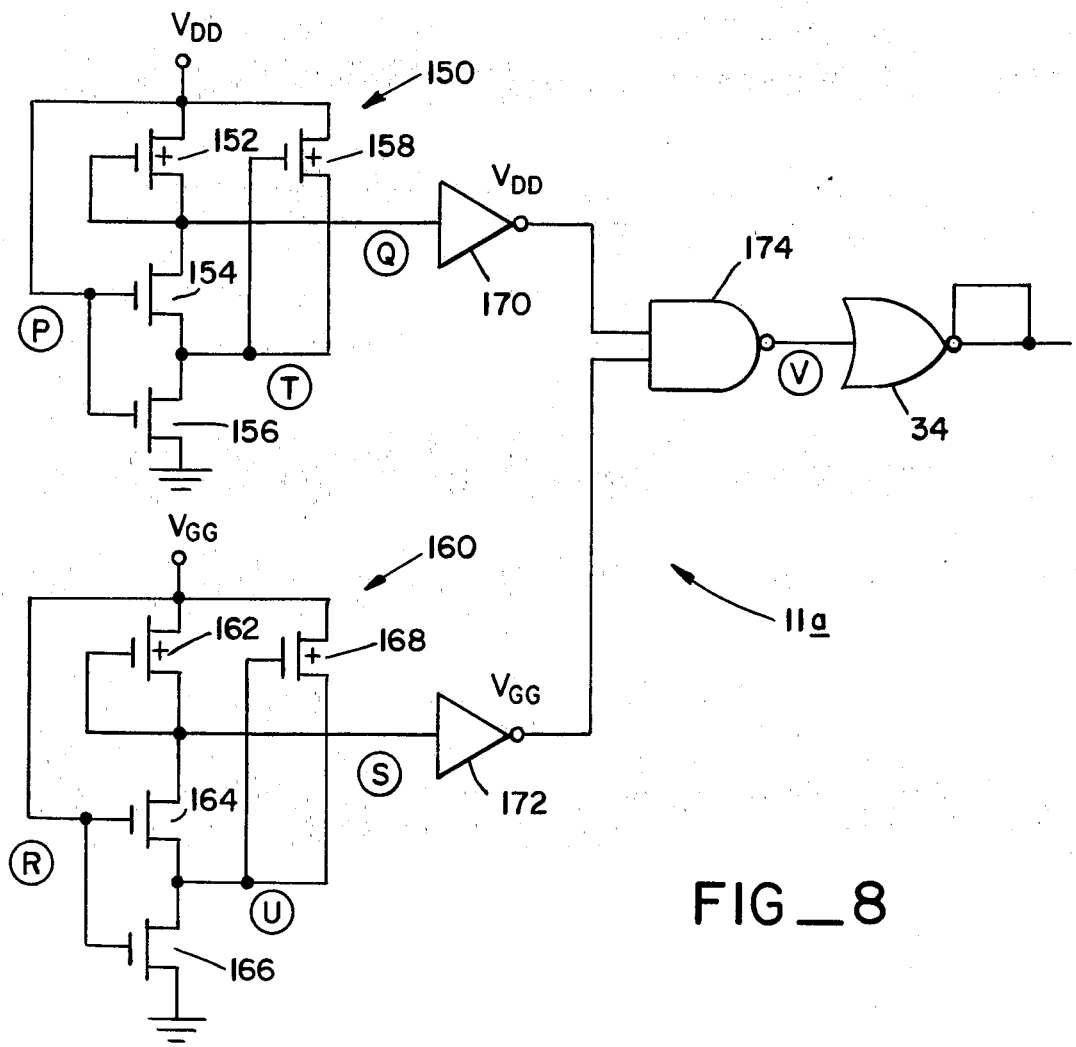
FIG_8

POWER-ON INITIALIZING CIRCUIT FOR A CALCULATOR SYSTEM

BACKGROUND OF THE INVENTION

This invention relates to an initializing circuit for an electronic calculator or computing system.

In electronic logic systems such as calculator circuits an initializing circuit is essential at power turn-on to provide a pulse of a duration sufficient to reset the system to the appropriate rest state, that is, to initialize all the relevant storage elements in the system so that they are ready to perform their logic functions in the proper manner. Moreover, this initializing pulse must do this every time the calculator system is turned on, and only for a reasonable period of time following the appearance of viable power supplies. Once generated to perform its initializing function, it must shut off and stay off so as not to interfere in any way with the regular operation of the system.

Fundamentally, the problem of providing a useful initializing pulse circuit involves the problem of how to generate the pulse and also of determining when to generate it. The latter factor requires a capability of sensing when the power comes on. This problem is aggravated when the circuit is energized by two power supplies having variable rise times.

Experience, particularly with low cost calculators, has shown that an initializing circuit must tolerate power supply rise times of at least up to 0.5 msec. and sometimes up to 20 msec. or possibly more. It must tolerate noisy power supplies on turn-on, and it must not impose special sequencing on the power supplies when more than one supply is required. A general object of the present invention is to provide an initializing circuit that solves the aforesaid problems.

Another more specific object of the present invention is to provide a power-on initializing circuit for an electronic logic circuit that is capable of handling relatively long power supply rise times; that is capable of fast recovery on turn off/turn on; that is independent of power supply sequencing when two power supplies are used; and that is immune to noise on turn-on with a single power supply and is also immune to noise on turn-on of two power supplies provided that the two power supplies track.

Still another object of the present invention is to provide an initializing circuit for an electronic calculator particularly adaptable for implementation as an integrated circuit semiconductor device of the MOS (metaloxide-silicon) type utilizing both enhancement mode and depletion mode transistor devices and one that minimizes the use of unorthodox circuit elements.

Another object of the present invention is to provide a power-on initializing circuit for an electronic logic circuit that is capable of producing an initializing pulse of a minimum of one or more bits of delay or of using a one bit of delay to a wider initializing pulse, where necessary.

Yet another object of the present invention is to provide an initializing circuit that is particularly adaptable for use in small, one-chip electronic calculators.

SUMMARY OF THE INVENTION

In general, a circuit according to the principles of the present invention comprises a power-on level detecting section which functions upon turn-on of the calculator to control the system's two phase clock buffers. The two clock phases $\phi1$ and $\phi2$ are furnished to a power-on pulse generating feedback network which consists of a bit of delay and a latch to limit the pulse duration. Thus, this feedback network guarantees a minimum of one bit time duration for the power-on level detected and the one way (set only) latch which guarantees that the initializing circuit will not interfere with the normal operation of the calculator system once the power level has been generated.

An inherent difficulty in the design of a power-on reset circuit is essentially involved in the lack of predictability of the initial state of the circuit. The problem is two-fold. First the circuit must reach a predictable state at turn-on when all nodes are initially at zero. Secondly, all relevant nodes must decay to zero at turn-off. To solve the first problem the circuit is made to operate in general as follows:

When the power of the calculator is turned on the clock buffers are forced to an initial state of $\phi1 = 0$, $\phi2 = 1$ by a clock disable node of the level detecting section. This prevents the premature transfer of the power-on detected level to a primary node of the pulse generating section. Meanwhile, the one-way latch comes on in the OFF state by virtue of a timing imbalance between its two nodes, one of which is a depletion mode pull-up device that rises fast compared to a saturated enhancement mode pull-up device. This guarantees an undisturbed logic 1 level at the power-on level detector. When the clock phases $\phi1$ and $\phi2$ are at their functional voltage levels guaranteed by the level detector, the clock disable will go to a 0 level and stay there for the duration of normal system operation. The two phase clock generator is now able to oscillate at the incoming clock frequency, and the power-on level detected at the primary node of the pulse generator section can now be transferred through the bit of delay to start the power-on pulse at its output node. The logic 1 level permanently sets the one-way-latch, which in turn discharges the primary node for the duration of normal system operation. The logic 0 level at this primary node is transferred via the bit of delay to the output node and the power-on pulse is terminated.

If a pulse longer than one bit time is necessary, the power-on pulse can be used to set a power-reset flip-flop and reset a counter. The output of the power-reset flip-flop thus becomes the initializing pulse. After the power-on pulse is gone, the counter can count the duration of the desired power-reset pulse and then reset the power-reset flip-flop to terminate the initializing pulse.

To solve the aforesaid second problem of decaying to zero at turn-off, the circuit is designed to leak charges off quickly on turn-off by taking advantage of depletion mode pull-ups wherever possible. In places where saturated enhancement modes were mandatory, such as the one-way-latch or where coupling devices prevent leakage, enhancement mode devices acting as bleeders are used to leak the voltage down to one threshold above the substrate voltage or ground. In places where this voltage residue creates a problem, these sensitive gates following such a node are incorporated into And gates where body effect prevents them from responding prematurely.

Other objects, advantages and features of our invention will become readily apparent from the following detailed description which is presented with the accompanying drawing.

BRIEF DESCRIPTION OF THE DRAWING

FIG. 1 is a combined circuit and logic diagram of the two voltage power-on level detecting circuit for the present system;

FIG. 2 is a combined circuit and logic diagram of a power-on pulse generator according to the present invention which utilizes the clock outputs of the circuit of FIG. 1;

FIGS. 3 – 6 are a series of diagrammatic views showing circuit equivalents of logic symbols used in the diagrams of FIGS. 1 and 2;

FIG. 7 is a logic diagram of an alternate level detector which may be used in the embodiment of FIG. 1; and FIG. 8 is a combined circuit and logic diagram of the level detector of FIG. 7.

DETAILED DESCRIPTION OF EMBODIMENT

Referring to the drawing, FIG. 1 is a schematic diagram of a two voltage power-on level detecting circuit 10 forming a first section of an initializing circuit embodying the principles of the present invention. This detecting circuit 10 provides regulated clock outputs $\phi 1$ and $\phi 2$ in a particular phase relationship so as to control the operation of a second circuit section 12 which is a power-on pulse generator that produces the initializing pulse for the relevant logic elements of the calculator or computer circuit. The clock outputs $\phi 1$ and $\phi 2$ may also be used for the main calculator logic circuitry (not shown). The detecting circuit 10 is connected to a single phase clock generator 14 and to two power sources $V_{DD}$ and $V_{GG}$. The latter power supply $V_{GG}$ is also connected at various points in the second circuit section 12. In a typical electronic calculator system, $V_{DD}$ produces a steady supply voltage in the range of 5.5 volts to 6.9 volts and $V_{GG}$ may provide supply voltages from 8.7 volts to 11.1 volts.

In a level detecting section 11 of the circuit 10 the voltage source $V_{GG}$ is connected to a voltage divider network consisting of two depletion mode transistors 16 and 18, the gates of which are connected to their respective sources. The source of transistor 16 is also connected through a node A to the drain of transistor 18 whose source and gate are also connected to ground. The gates of transistors 16 and 18 are connected by a lead 20 through a (delaying) capacitor 22 (e.g. 4pf). The transistors 16 and 18 are ratioed to create the voltage divider network so that a logic 1 level is produced at node A wherein $V_{GG}$ is applied and reaches a relevant level. For example, the transistor 18 should have around 10 times the resistance of transistor 16. The capacitor is used to add an additional delay to the rise time of $V_{GG}$ to its relevant level in the creation of the logic 1 level at node A.

The node A is connected to the gate of a transistor 24 whose drain in connected to the other power source $V_{DD}$. The source of this transistor is connected to a node B and to the drain of a depletion mode transistor 26 whose source and gate are connected to ground. The network of transistors 24 and 26 transfers the logic level from node A to node B, when the power source $V_{DD}$ comes on. This network is ratioed so that it will operate only after $V_{DD}$ and $V_{GG}$ reach their relevant levels. For example, and transistor 26 should have 5 – 10 times the resistance of transistor 24.

The output of node B is connected to a time delaying means comprised of three logic networks 28, 30 and 32 connected in series, and shown by their appropriate logic symbols to conserve space. The circuit implementation of each of these devices is well known but for clarity they are illustrated in FIGS. 3 – 6 together with other logic networks used in our circuit. As shown, each network includes a depletion mode pullup device or an enhancement pullup device connected to $V_{DD}$ or $V_{GG}$ and used in conjunction with enhancement mode pull down devices in the well known manner to create conventional logic structures.

The device 28 is a Nand gate with a depletion mode pullup device whose output at a node C is furnished to the device 30 which is an inverter with a depletion mode pullup device. The output of device 30 at a node D is supplied to the device 32 which is also an inverter using a depletion mode device and having an output at a node E.

The output of the inverter device 32 at node E is furnished to a Nor gate network 34 having a depletion mode pullup device which is connected to the $V_{DD}$ power source. This logic network also receives an input from the suitable single phase clock generator 14 which produces a pulsing output at the desired clock frequency.

The output of the Nor gate 34 at a node F is connected to a junction 36 and thence to a suitable two phase clock generator. In the embodiment shown in FIG. 1 the latter comprises a depletion mode inverter 38 providing an output node G and a cross coupled latch consisting of two depletion mode Nor networks 40 and 42 which provide the clock output $\phi 1$ and $\phi 2$.

Thus, the output from node F goes through junction 36 to the inverter 38 and then to the clock Nor network 40, while the signal from node F is also furnished directly to clock Nor network 42. The devices 38, 40 and 42 are all connected to the $V_{GG}$ power source and their outputs at nodes H and I are cross connected as inputs to the other device in a typical cross latch arrangement. Equivalent circuit means other than the buffer arrangement shown may be used to produce these two phase clock outputs $\phi 1$ and $\phi 2$ which are supplied to the pulse generator circuit 12.

As shown in FIG. 2, the pulse generator circuit 12 comprises a transistor 50 whose gate and drain are connected to $V_{GG}$ and whose source is connected through a junction 52 at a node J to the drain of a depletion mode transistor 54 whose source and gate are connected to ground. The node J is connected through a junction 56 to the drain of a transistor 58 whose source is connected to ground. This junction 56 is also connected to a bit-of-delay circuit which comprises a transistor 60 whose gate is connected to the clock $\phi 1$. The source of transistor 60 is connected to a junction 62 from which extends one lead 64 to a capacitor 66 (e.g. 2pf) connected to ground. Another lead 68 extends from the junction 62 to the gate of a transistor 70 whose drain is connected to $V_{GG}$ power. The junction 62 at a node K is connected to another junction 72 from which a lead is connected to the source of transistor 70. The junction 72 is also connected as one input to a Nand logic network 74 having a depletion mode pullup device connected to $V_{GG}$ power and whose other input is also connected to $V_{GG}$. The output node L of network 74 is connected to the drain of another transistor 76 whose gate is connected to the clock $\phi 2$ and whose source is connected to a junction 78. One lead 80 from this junction is connected through a capacitor 82 (e.g. 2pf) to ground. The junction 78 is also connected to an inverter network 84 having a depletion mode pullup device connected to the power source $V_{GG}$. The output of network 84 at node M is the initializing pulse of one-bit time for the system which is provided at a junction 86. This pulse output is supplied to the relevant logic circuit through a lead 88, and it is also fed back to the pulse circuit to accomplish the required positive cutoff of the initializing pulse. Thus, extending from the junction 86 is a lead 90 which is connected to a junction 92 that in turn is connected to the gate and source of a transistor 94, whose drain is connected to the $V_{GG}$ power source. The source terminal of transistor 94 is also connected as one input to a logic And device 96 whose other input is connected to the clock $\phi 2$. A similar And device 98 has one input from the power source $V_{GG}$ and a feedback input through a lead 100. The outputs of these latter two devices 96 and 98 are connected to a logic Nor network 102 which includes a depletion mode pullup device connected to the $V_{GG}$ power source. The output of this latter network at a node N is connected to an inverter network 104 which also includes a depletion mode pullup device connected to $V_{GG}$. The output network 104 at a node O is connected to a junction 106 and thence to the source and gate of a bleeding transistor 108 whose drain is connected to a source $V_{GG}$. The node O is also connected to a junction 110 from which one branch lead 112 is connected to a capacitor 114 having a ground connection. Another branch lead 116 from junction 110 is connected to the gate of the transistor 58 at node J to complete the feedback loop.

In describing the operation of our initializing circuit, the situation wherein the power source $V_{DD}$ is turned on before the power $V_{GG}$ shall be considered first. When $V_{DD}$ is turned on, node E of the level detecting circuit 10 is at a logic 1 level because networks 28, 30 and 32 are receiving $V_{DD}$ power and node B being at logic 0 keeps node D at 0. Now, when $V_{GG}$ power is turned on and, assuming a rise time of the order of milliseconds, all $V_{GG}$ nodes will start to rise at the $V_{GG}$ rate, modified by circuit time constants. With respect to node A, its rise time will be far slower than the rise time of $V_{GG}$ due to the contribution of pull down transistor 18 and capacitor 22. Specifically, nodes G, H and I of the latching two phase clock generator network will go toward $V_{GG}$. Since node F is still at a logic 0 and cannot go to a logic 1 level unless $V_{GG}$ is high enough to drop about more than two threshhold voltages ($2V_T$) the DC latch at nodes H and I will move into an initial state such that $\phi 2$ is a logic 1 and $\phi 1$ is a logic 0. These two phase clock outputs are now controlled to remain in steady state by the detecting circuit 10 as they are applied to the pulse generating section 12. When $\phi 2$ is a logic 1, the nodes L and M are both rising toward $V_{GG}$. If node M were to reach about its threshold level, it could put the latch nodes N and O of devices 102 and 104 in the wrong state. Node M is thus made to rise slower than node L by making the pullup of node M a saturated enhancement mode load, which guarantees that on power turn-on it will never rise about the threshold level. The bleeder transistor 94 at node M further guarantees that when the power is turned off this node will leak off to a minimum of one threshold voltage $V_T$ above the substrate or ground voltage $V_{SS}$. Connecting node M to the second device in the AND stack 96 guarantees that when the power is turned on again, this residual voltage will not trip the latch. This prevents the occurrence of any short logic 1 level pulse at node M which would set the one-way latch of devices 102 and 104 but not initialize the system.

When the $\phi 1$ clock is operating, the pulse produced at node J is applied to the one-bit-of-delay section before it appears at node M. Thus, at this node, the initializing pulse appears for a definite time period and is applied to the main logic circuitry of the calculator to place all relevant elements in the ready state. Then the pulse is discontinued and does not appear again as long as the calculator stays on. When the calculator power is shut off the nodes K and L of the bit-of-delay circuit are discharged through the capacitors 66 and 82 and charge is bled off through the transistor 70 at node K.

If an initializing pulse longer than one-bit-time is desired a clocked Power-Reset flip-flop circuit 120 may be used together with a counter 122 to generate a longer pulse. As shown in FIG. 2, the pulse provided at output junction 86 is furnished to the "set" terminal of the flip-flop circuit, and it is also simultaneously supplied to the "reset" terminal of the counter which also has a timing input. The pulse applied to the counter reset overrides its counter advance to activate the counter. When the one-bit power-on pulse from junction 86 is gone, the counter continues to count for a predetermined time duration and then provides a signal through an output lead 124 to reset the flip-flop and terminate its extended initializing pulse output.

In the situation where $V_{DD}$ power is turned on after the $V_{GG}$ power, the operation may be described as follows: When $V_{GG}$ is turned on, node A is at the logic 1 level because of current flow through the depletion mode devices 16 and 18.

At this point the nodes B, C, D, E and F are at a logic 0 level because $V_{DD}$ power has not yet been supplied to the devices 28, 30, 32 and 34. Now, as $V_{GG}$ rises, nodes G, H and I of the clock latching network also rise toward $V_{GG}$. With node F at a logic 0, and since node G is designed to be faster than the Nor gate 40, the output of node I ($\phi 2$) will go to a logic 1 and the output of node H will go to a logic 0, because of the cross latching arrangement. Thus, the clocks are stopped with $\phi 2$ at logic 1 and $\phi 1$ at logic 0. At this same time in the pulse generating section 12 the node O has gone to a logic 0 and node N has gone to a logic 1 because of asymmetry in the latch devices 102 and 104.

Now, assume that $V_{DD}$ is switched on. Nodes E and F will start rising toward $V_{DD}$ and as $V_{DD}$ rises above threshold, it is detected by the Node B and propagates through nodes C, D and E. The detection of the voltage at Node B happens at a higher level of $V_{DD}$ than would otherwise be the case because of the contribution of transistor pull-down 26 which makes the rise of the voltage at Node B much slower than the normal rise time of $V_{DD}$. The output of node E becomes a logic 0 thereby causing the Nor gate 34 and the clocks $\phi 1$ and $\phi 2$ to be enabled. After this, the circuit operation is the same as in the previous case.

If the power supplies $V_{DD}$ and $V_{GG}$ come on together, the $\phi 2$ clock will go to a logic 1 and the $\phi 1$ clock will go to a logic 0 until the signal produced by the power sources propagates through nodes B, C, D and E and takes the output of node E to 0. At this time the clocks $\phi 1$ and $\phi 2$ are enabled and are applied as previously described relative to the circuit section 12 to produce the initializing pulse.

Thus, we see from above that in all the three cases above, $\phi 2$ is 1 and $\phi 1$ is 0 when the clocks are enabled and the power sources $V_{GG}$ and $V_{DD}$ have reached their normal levels. When this occurs, the circuit operation is as follows: The node J of the circuit 12 is at a logic 1 level, node L is also at a logic 1 level; when $\phi 2$ is on or at a logic 1, node M is at 0. Thus, node N remains at a logic 1 and node O remains at a logic 0. When $\phi 2$ goes off or to a logic 0 and $\phi 1$ comes on, node K goes to 1 and node L goes to 0. On the next $\phi 2$, the node at junction 78 goes to 0 and node M goes to 1, thereby taking node N to 0 and node 0 to 1. This discharges node J to a 0. After a bit-time, node M becomes a zero and the power-on reset pulse is turned off.

The operation of our initializing circuit with respect to FIG. 2 has been described above for the initial condition of $\phi 1$ being at a 0 and $\phi 2$ being at a 1, because the level detecting and clock circuit of FIG. 1 is designed to provide this state on power-on. However, it should be noted that the circuit in FIG. 1 may be designed to come up with $\phi 2$ at 0 and $\phi 1$ at 1, and if so, the circuit 12 in FIG. 2 will still provide the desired initializing pulse. This will be readily understood by the following explanation.

If $\phi 1$ goes to 1 on power turn-on and $\phi 2$ goes to 0, the node J is at a 1. Since $\phi 1$ starts off at a 1, node K would be at a 1, and therefore, node L will be at a logic 0. The node at junction 78 starts off at 0, hence node M would be a 1. Node N and node O would be at 0 and 1 respectively as before because of asymmetry in the latch.

Now, when $\phi 1$ goes to 0 and $\phi 2$ goes to 1, an 0 is transferred from node L to junction 78, so that node M remains at 1. At the same time the upper AND gate 96 of node N is turned ON by virtue of node M and $\phi 2$ being 1. This causes node N to go to 0, thereby taking node 0 to a 1. Thus, node 0 causes node J to go to 0 and after one bit time node M goes to 0 ending the power-on pulse.

In the embodiment of our invention shown in FIG. 1, the level detecting section 11 of the circuit comprises the $V_{DD}$ and $V_{GG}$ divider networks and the gate circuits 28, 30 and 32 which function together to furnish an input to the clock disable gate 34. This form of level detector is satisfactory even for low voltage power supplies.

If higher voltage power supplies are used an alternate form of level detector section 11a, shown in block diagram form in FIG. 7, may be advantageously utilized which will also furnish the necessary disabling clock input signal to the clock disable gate 34 for operating the remaining portion of the initializing circuit in the manner described. This level detector 11a functions properly despite which power supply ($V_{DD}$ or $V_{GG}$) is turned on first, and therefore it removes any power sequencing requirement. It also requires less silicon area than the level detecting section 11 when implemented as in integrated MOS devices, although it is not applicable for relatively low voltage power supplies such as those outputting $-3.5$ volts or less.

Generally, as shown in the logic diagram of FIG. 7, this detection section 11a comprises a first level shifter and inverter circuit 150 connected to the $V_{DD}$ power source at an input node P in combination with a second similar level shifter and inverter circuit 160 connected at a node R to $V_{GG}$. The outputs of these first and second circuits, nodes Q and S respectively, are furnished to a pair of inverters 170 and 172 respectively, whose outputs are in turn supplied to a Nand gate 174. The output of the latter gate, node V, is connected as one input to the clock disable gate 34 of the embodiment shown in FIG. 1.

The level shifter circuits 150 and 160, as shown in FIG. 8, are functionally identical. The first level shifter 150 consists of four interconnected transistor elements: two depletion mode transistors 152 and 158 and two enhancement mode transistors 154 and 156. Likewise the second level shifter consists of two depletion mode transistors 162 and 168 interconnected with the two enhancement mode transistors 164 and 166. As both circuits 150 and 160 are identical in configuration and operation, only the first level shifter circuit will be explained in detail, and it is to be understood that the following explanation applies with equal force to both level shifter circuits 150 and 160.

Considering first the circuit consisting of the series connected transistors 152, 154 and 156 and disregarding transistor 158, it becomes apparent that the transistors 152, 154 and 156 essentially comprise a Nand gate. In this Nand circuit the resistance ratio of the depletion device 152 to the series connected enhancement elements 154 and 156 combined is such that when an input level to be detected ($V_{DD}$ in the case of the first circuit 150, $V_{GG}$ in the case of the second 160), reaches a voltage slightly greater than the threshold voltage of the element 156, the voltage at the output node Q (node S for circuit 160) approaches zero or ground potential. This occurs because the conduction resistance of the depletion element 152 is high and that of the combined enhancement devices 154 and 156 is relatively low.

Because of the body effect phenomena (or source to substrate bias effect) it will take a higher input voltage at the input node P to turn on the middle transistor 154. For example, using p-channel elements, if $-1V$ is required to turn on the lower element 156, it will require about $-1.5V$ to turn on the middle element 154. Thus, in such a structure, with an input of about $-2V$ at node P, the output node Q will approach zero or ground potential.

In the foregoing analysis, the parallel depletion node element 158 has been assumed to be absent. With that device 158 present, the combination of the lower enhancement device 156 with the depletion load device 158 forms an inverter. But this combination is not an inverter in the sense that the conduction resistance of the load element 158 is only about twice that of the enhancement element 156 as compared to the resistance ratio of about 10 existing between the depletion element 152 and the combined enhancement elements 154 and 156.

Now consider the whole level shifter and inverter circuit 150. Assume steady state $V_{DD}$ is applied to the input node P at a potential high enough to turn on the lower enhancement device 156 but not sufficiently high to turn on the middle device 154. Since the middle device 154 is off and presents a very high resistance in the off mode, the devices 152 and 154 do not affect the operation of the circuit 150. The conduction resistance ratio of series connected elements 156 and 158 will establish a voltage of about ⅓ $V_{DD}$ at node T, (node U in the circuit 160).

Assume $V_{DD}$ is $-6V$ which produces the $-2V$ at node T. In order for the middle element 154 to turn on, the input voltage will have to be at least $-2V$ plus the body effect above the threshold voltage of the middle transistor 154 (i.e. about $-3.5V$) to turn it on and cause the output node Q to approach zero volts. When the input is less than about −3.5V, the output node Q stays at the $V_{DD}$ potential. In the absence of the device 158 an input voltage of −1.5V to −2V would have brought the output node Q down to approach zero potential. Thus, the element 158 has shifted the acceptance level of the input signal from −1.5V to about −3.5V. In like manner the element 168 functions to shift the acceptance level of the input signal aplied to node R of the second shifter circuit 160 from −1.5V to about −3.5V.

We have explained the shifter circuits 150 and 160 by assuming that an input signal has been applied to the parallel gates of the enhancement devices 154 and 156. If those gates are connected directly to the power supply and the input signal is then $V_{DD}$ for the first shifter circuit 150 and $V_{GG}$ for the second 160 (which voltages will be slowly rising on initial power turn on) each circuit behaves in the manner just described and the output nodes Q and S will approach zero potential as the respective input signals $V_{DD}$ and $V_{GG}$ exceed about −3.5V before the respective output nodes Q and S will go to zero. In the case of the circuit 150 the output node Q is input to the inverter 170 the output of which forms one input to the Nand gate 174. Similarly, the output node S of the circuit 160 is inverted to the Nand gate 174. When the input signal $V_{DD}$ or $V_{GG}$ to either level shifter circuit 150 or 160 is below −3.5V to −4V, the output node Q or S will remain at a logic 1, and, being inverted by the inverter 170 or 172, will remain at a logic 0, which means that the output node V of the Nand gate 174 remains at a logic 1. When the Nand gate output is connected to one input of the clock disabling gate 34, the clock 14 remains disabled until both power supplies have reached operating levels, regardless of which power supply is turned on first.

Thus, this alternate perferred level detector circuit 11a advantageously enables both power supplies outputting $V_{DD}$ and $V_{GG}$ to obtain reasonably high operating levels before the clock is enabled, thereby eliminating uncertainties and abnormalities in the operation of the main circuit because of initially low power supply levels.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:
1. An initializing circuit for an electronic calculator comprising:
 a level detecting means connected to the calculator power supply;
 a pair of clock buffers connected to and controlled by said level detecting means to provide alternating two phase clock outputs when the turn-on power reaches a pedetermined level; and a power-on pulse generator cicuit means connected to said power supply, said circuit means being also connected to and controlled by said two phase clock outputs for producing an initializing pulse output with at least a one bit time duration.

2. The initializing circuit of claim 1 wherein said level detecting means includes divider network connected to the calculator power supply, a delay means connecting the output of said divider network to an enabling means, said two phase clock buffer means being connected to the output of said enabling means.

3. The initializing circuit of claim 2 wherein said divider network includes a first pair of series connected field effect transistors connected to the first of two calculator power supplies and providing an output to second pair of series connected field effect transistors connected to the second calculator power supply.

4. The initializing circuit of claim 3 wherein said delaying means comprises a logic Nand network and a pair of logic inverter networks in series, all of said logic networks being connected to said second calculator power supply through a depletion mode pullup device.

5. The initializing circuit of claim 4 wherein said enabling means comprises a logic Nor gate connected to a single phase clock generator and to said delaying means.

6. The initializing circuit of claim 2 wherein said power-on pulse generator means includes an input network connected to a calculator power source, a one-bit-of-delay network connected to said input network and providing said initializing pulse output, and means connected between the one-bit-of-delay output and said input network for terminating the initializing pulse.

7. The initializing circuit of claim 6 wherein said means for terminating the initializing pulse includes a latching circuit providing an output to the gate of a transistor connected to the output of the input network and providing a path to ground.

8. The initializing circuit of claim 6 including means for extending the duration of the initializing pulse beyond a one-bit time including a power reset flip-flop circuit and a counter connected to the output of said one-bit-of-delay, counter providing a feedback input to said flip-flop for terminating the initializing pulse after a pre-selected time duration.

9. The initializing circuit of claim 1 wherein said level detecting means comprises a first level shifter and inverter circuit connected to the first of two power supplies and a second level shifter and inverter circuit connected to the second calculator power supply, delay means connecting the outputs of both said level shifter and inverter circuits to an enabling means, said two phase clock buffer means being connected to the output of said enabling means.

10. The initializing circuit of claim 9 wherein each said level shifter and inverter circuit comprises four interconnected field effect transistors including a first transistor having its source connected to substrate potential and its drain connected to the source of a second transitor, the drain of which is connected to the source and gate of a third transistor and forms the output of said level shifter and inverter circuit, and a fourth transistor having its source and gate connected together to the drain of said first transistor, and wherein the gate of said first and second transistors are connected to one of said power supplies.

11. The initializing circuit of claim 10 wherein said first and second transistors are enhancement mode devices and said third and fourth transistors are depletion mode devices.

12. An initializing circuit for an electronic calculator having dual power supplies comprising:
 a level detecting circuit section including a first network connected to one power supply and a second network which is connected to a second power supply;
 a delay means connected to the output of said level detecting circuit section and providing one input tc a clock enabling device having its other input connected to a clock signal generator;

clock buffer and latching means connected to the output of said enabling device to provide clock outputs of two distinct phases in the same sequence despite the sequence of turn-on for the two power supplies; and a pulse generating circuit connected to and controlled by said phase controlled clocks including a first network connected to one said power source and having an output node, a bit-of-delay network connected to said output node providing an initializing pulse output, and a feedback means connected to said pulse output and also to said output node of said first network for assuring the automatic turn-off of the initializing pulse after a predetermined time period.

13. An initializing circuit for an electronic calculator having dual power supplies comprising:

a first circuit section connected to said two power sources for providing two clock outputs in a predetermined phase relationship despite any variations in turn-on sequencing or rise time of the power sources;

a second circuit section including means connected to one power source for producing an initial pulse and delay means for receiving said initial pulse and also said clock outputs to provide an initializing pulse output; and feedback means connected between the output of said delay means and said initial pulse producing means for assuring the termination of said initializing pulse after a predetermined time period.

* * * * *